US007405157B1

(12) United States Patent
Reid et al.

(10) Patent No.: US 7,405,157 B1
(45) Date of Patent: Jul. 29, 2008

(54) METHODS FOR THE ELECTROCHEMICAL DEPOSITION OF COPPER ONTO A BARRIER LAYER OF A WORK PIECE

(75) Inventors: Jon Reid, Sherwood, OR (US); Seyang Park, Beaverton, OR (US)

(73) Assignee: Novellus Systems, Inc., San Jose, CA (US)

( * ) Notice: Subject to any disclaimer, the term of this patent is extended or adjusted under 35 U.S.C. 154(b) by 360 days.

(21) Appl. No.: 11/071,135

(22) Filed: Mar. 2, 2005

Related U.S. Application Data

(63) Continuation-in-part of application No. 10/705,579, filed on Nov. 10, 2003, now Pat. No. 7,341,946.

(51) Int. Cl.
 *H01L 21/44* (2006.01)
(52) U.S. Cl. .................. 438/677; 438/674; 205/187; 205/291
(58) Field of Classification Search ................. 438/652, 438/674, 677; 205/183, 186, 187, 291
 See application file for complete search history.

(56) References Cited

U.S. PATENT DOCUMENTS

| | | | |
|---|---|---|---|
| 6,245,288 B1 * | 6/2001 | Carroll | 419/34 |
| 6,652,990 B2 * | 11/2003 | Carey et al. | 428/647 |
| 6,974,531 B2 * | 12/2005 | Andricacos et al. | 205/102 |
| 7,135,404 B2 * | 11/2006 | Baskaran et al. | 438/652 |
| 2005/0098440 A1 * | 5/2005 | Kailasam et al. | 205/183 |

OTHER PUBLICATIONS

Lee et al.; "Enhancement of Iodine Adsorption on Ruthenium Glue Layer for Seedless CECVD of Cu"; *Electrochemical and Solid-State Letters*, 8; 2005; pp. C39-C42; *The Electrochemical Society*; Korea.
Liu et al.; "The Effects of an Iodine Surface Layer on Ru Reactivity in Air and During Cu Electrodeposition"; *Journal of The Electrochemical Society*, 152; 2005; pp. G115-G121; *The Electrochemical Society*; Denton, Texas.
D. Josell, D. Wheeler, C. Witt, and T.P. Moffat; "Seedless Superfill: Copper Electrodeposition in Trenches with Ruthenium Barriers"; *Electrochemical and Solid-State Letters*, vol. 6; Jun. 5, 2003; pp. C143-C145.
M.W. Lane, C.E. Murray, F.R. McFeely, P.M. Vereecken and R. Rosenberg; "Liner Materials for Direct Electrodeposition of Cu"; *Applied Physics Letters*, vol. 83, No. 12; Sep. 22, 2003; pp. 2330-2332.
O. Chyan, T.N. Arunagiri and T. Ponnuswamy; "Electrodeposition of Copper Thin Film on Ruthenium, A Potential Diffusion Barrier for Cu Interconnects"; *Journal of the Electrochemical Society*, vol. 150; Oct. 8, 2002; pp. C347-C350.

* cited by examiner

*Primary Examiner*—Carl Whitehead, Jr.
*Assistant Examiner*—Colleen E Rodgers
(74) *Attorney, Agent, or Firm*—Ingrassia Fisher & Lorenz, P.C.

(57) ABSTRACT

Methods are provided for electrochemically depositing copper on a work piece. One method includes the step of depositing overlying the work piece a barrier layer having a surface and subjecting the barrier layer surface to a surface treatment adapted to facilitate deposition of copper on the barrier layer. Copper then is electrochemically deposited overlying the barrier layer.

15 Claims, 1 Drawing Sheet

METHODS FOR THE ELECTROCHEMICAL DEPOSITION OF COPPER ONTO A BARRIER LAYER OF A WORK PIECE

CROSS-REFERENCES TO RELATED APPLICATIONS

This is a continuation-in-part of application Ser. No. 10/705,579 filed Nov. 10, 2003 now U.S. Pat. No. 7,341,946.

TECHNICAL FIELD

The present invention generally relates to the electrochemical deposition of a metal, and more particularly relates to electrochemical deposition of copper directly onto a barrier layer of a work piece.

BACKGROUND

The production of integrated circuits begins with the creation of high-quality semiconductor wafers. During the wafer fabrication process, the wafers may undergo multiple dielectric and conductor deposition processes followed by the masking and etching of the deposited layers. Some of these steps relate to metallization, which generally refers to the materials, methods, and processes of wiring together or interconnecting the component parts of an integrated circuit located on or overlying the surface of the wafer. Typically, the wiring of an integrated circuit involves etching features, such as "trenches" and "vias," in a planar dielectric (insulator) layer and filling the features with a conductive material, typically a metal.

In the past, aluminum was used extensively as a metallization material in semiconductor fabrication due to the ease with which aluminum could be applied and patterned on the wafer. In addition, aluminum metallization does not suffer from the leakage and adhesion problems experienced with the use of gold. Other metallization materials have included such materials as Ni, Ta, Ti, W, Ag, Al(Cu), TaN, TiN, CoWP, NiP and CoP, alone or in various combinations.

Recently, techniques have been developed which utilize copper to form conductive contacts and interconnects because copper is less susceptible to electromigration and exhibits a lower resistivity than aluminum. Since copper does not readily form volatile compounds, the plasma etching of copper is difficult. Hence, conductive contacts and interconnects often are formed using a damascene process. In accordance with the damascene process, the copper conductive contacts and interconnects are usually formed by etching features such as vias and/or trenches within a blanket insulating material. The vias and/or trenches may be formed wholly within one insulating material layer or may be etched to expose other insulating material layers or metallic layers. A barrier layer, which serves to prevent catastrophic contamination caused by copper diffusing through the interlayer dielectrics, typically may be deposited onto the surface of the insulating material and within the vias and/or trenches. Because it is often difficult to form a copper metallization layer directly overlying the barrier layer using electroplating, a seed layer of copper may be deposited onto the barrier layer. Then, a copper metallization layer may be electrodeposited onto the seed layer to fill the vias and/or trenches. The excess copper metallization layer, the copper seed layer, and the barrier layer overlying the insulating material outside the vias and/or trenches then may be removed, for example, by a process of chemical mechanical planarization or chemical mechanical polishing, each of which will hereafter be referred to as chemical mechanical planarization or CMP.

Tantalum (Ta), tantalum nitride (TaN), and titanium nitride (TiN) currently are used as barrier layers in copper interconnects. However, it is difficult to electroplate copper directly onto thin barrier layers of Ta, TaN, and TiN because these barrier materials are highly resistive. Further, Ta, TaN, and TiN have a tendency to form an oxide film that is difficult to remove. This oxide film may prevent sufficient adhesion of the copper to the work piece. Accordingly, it is typically necessary to deposit a seed layer overlying the barrier layer to facilitate the deposition of copper. However, poor sidewall coverage and large overhang of the copper seed layer in the features may cause the copper electrofill to close off and leave voids in the features. As integrated circuits continue to scale to 90 nm, 65 nm, 45 nm and smaller technology nodes, it may become difficult to further decrease the dimensions of the barrier layer and seed layer in higher-aspect ratio features. This decrease is needed to allow for void-free filling with copper.

Barrier layers formed of ruthenium may present a desirable alternative to Ta, TaN, and TiN barriers. Ruthenium is an air-stable transition metal with a high melting point and is at least ten times more electrically conductive than tantalum. In addition, ruthenium generally shows negligible solid solubility with copper, thereby minimizing the adverse increase in the resistivity of copper from dissolution of dopants in the copper. Further, copper demonstrates suitable adhesion to ruthenium when directly deposited thereon. However, ruthenium demonstrates a tendency to form a ruthenium oxide layer overlying the ruthenium layer when exposed to ambient conditions. This ruthenium oxide layer may interfere with the deposition of copper directly onto the ruthenium layer and may cause non-uniform deposition of copper.

Accordingly, it is desirable to provide a method for the electrochemical deposition of copper directly on a barrier layer of a semiconductor substrate. In addition, it is desirable to provide a method for the deposition of copper on a semiconductor work piece wherein the method eliminates the need for the deposition of a seed layer overlying the barrier layer. Furthermore, other desirable features and characteristics of the present invention will become apparent from the subsequent detailed description and the appended claims, taken in conjunction with the accompanying drawings and the foregoing technical field and background.

BRIEF DESCRIPTION OF THE DRAWINGS

The present invention will hereinafter be described in conjunction with the following drawing figures, wherein like numerals denote like elements, and FIG. 1. is a cross-sectional view of a portion of a work piece having a barrier layer formed thereon.

DETAILED DESCRIPTION

The following detailed description is merely exemplary in nature and is not intended to limit the invention or the application and uses of the invention. Furthermore, there is no intention to be bound by any expressed or implied theory presented in the preceding technical field, background, brief summary or the following detailed description.

The invention disclosed and claimed herein is applicable to the deposition of metal onto a surface of a variety of work pieces, but will be described and illustrated with reference to only a single illustrative work piece, namely a semiconductor wafer having an insulating layer deposited thereon. Although the invention is illustrated with reference to its application only to one particular work piece and to one particular metal deposited on that work piece, it is not intended that the invention be limited to that particular application.

In particular, the present invention is directed to a method for electrochemical deposition of copper on a work piece. As used herein, unless otherwise specified, the term electrochemical deposition includes both the processes of electroplating and electrochemical mechanical deposition, also known as planar deposition. Electroplating typically involves conventional metal deposition using an electrolyte solution containing a metal, an anode, and a cathode. A polishing step, typically a chemical mechanical polishing step, may be performed during or after deposition to obtain a planar surface of desired thickness. Electrochemical mechanical deposition uses a dedicated apparatus that selectively deposits the metal on the work piece to obtain a planar metal surface of a desired thickness.

Figure 1:
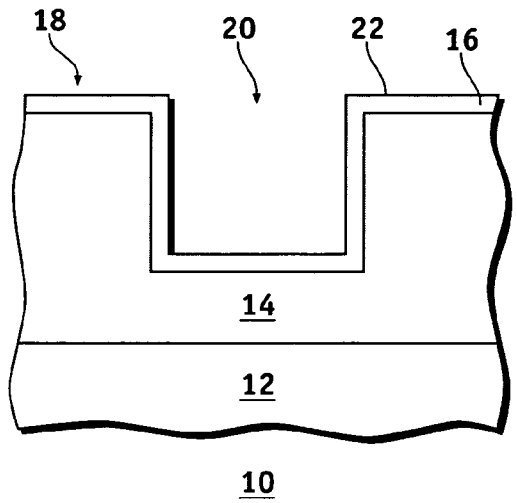

In accordance with various embodiments of the present invention, the methods of electrochemical deposition of copper on a work piece include the electrochemical deposition of copper onto a work piece 10, such as that illustrated in FIG. 1, that typically includes a semiconductor substrate 12, such as a silicon substrate. Substrate 12 may comprise one layer or multiple layers and can include circuitry, such as transistors, digital circuitry, and sense amplifiers, which circuitry has not been shown for simplicity. A layer of insulating material 14 overlies substrate 12. The insulating layer 14 may be a single layer of insulating material or may be composed of a plurality of layers of insulating material, not all of which are necessarily the same material. The layer of insulating material 14 may be or may include, for example, silicon dioxide, silicon nitride, or any of the other insulating materials commonly used in the fabrication of semiconductor devices. In accordance with one embodiment of the invention, the layer of insulating material 14 may include a layer of "low-k dielectric material" such as CORAL™ low-k dielectric material, provided by Novellus Systems, Inc. of San Jose, Calif. and formed by chemical vapor deposition. The term "low-k dielectric material" means a material having a dielectric constant less than about 3.9. While work piece 10 is illustrated in FIG. 1 having a layer of insulating material 14 directly overlying substrate 12, it will be understood that any number of layers of insulating or metallic materials may be formed overlying substrate 12 before formation of insulating material layer 14.

Work piece 10 may also have a field region 18 that is adjacent to a feature 20. As used herein, feature 20 is any sub-surface element, character or surface such as, but not limited to, a via or trench formed within work piece 10. The features can be formed by conventional photolithographic and etching techniques. The surface of layer 14 surrounding feature 20 is called the field region 18. Field region 18 is any adjacent element, character or surface that is elevated with respect to the features. Field region 18 is generally, but not necessarily, substantially planar in contrast to the features. Features formed during the processing of a semiconductor work piece can be of varying sizes, such as those having widths ranging from less than 100 nm to widths of several hundred microns. Feature 20 may be formed wholly within insulating material layer 14 or may be formed within insulating material layer 14 and any other layer(s) that has been formed between substrate 12 and insulating material layer 14. In one exemplary embodiment of the invention, feature 20 may be a via or a trench that has been etched to expose a metallic layer formed overlying substrate 12 and underlying insulating material layer 14.

Formed within feature 20 and overlying layer of insulating material 14 is a barrier layer 16. Barrier layer 16 can be formed of any suitable material that prevents or minimizes the diffusion of copper into insulating material layer 14 and that permits or facilitates the deposition of copper within feature 20 without the need for a seed layer, such as a copper seed layer. In addition, barrier layer 16 can be formed of any suitable material that exhibits suitable adhesion to the surfaces of feature 20 and thus is able to withstand delamination from feature 20 upon electrochemical mechanical deposition or chemical mechanical planarization (CMP). Examples of materials suitable for forming barrier layer 16 include ruthenium, cobalt, molybdenum, tungsten, rhodium, palladium, osmium, rhenium, iridium, and platinum. In a preferable embodiment of the present invention, barrier layer 16 is formed of ruthenium. Barrier layer 16 can be formed by physical vapor deposition (PVD), chemical vapor deposition (CVD), atomic layer deposition (ALD), electroless deposition, or any other suitable deposition method and can be formed to a thickness, for example, in the range of about 1 to 100 nm, preferably in the range of 1 to 15 nm.

Figure 2:
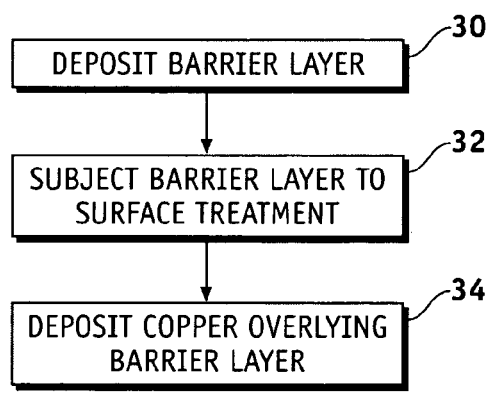
FIG. 2 is a flow chart illustrating the methods for the electrochemical deposition of copper onto a barrier layer in accordance with the present invention.

Referring to FIGS. 1 and 2, methods for electrochemical deposition of copper overlying barrier layer 16, in accordance with the various embodiments of the present invention, include depositing barrier layer 16 overlying insulating material layer 14 and within feature 20, step 30, and subjecting a surface 22 of barrier layer 16 to a surface treatment that is adapted to facilitate the deposition of copper on barrier layer 16, step 32. After subjecting barrier layer 16 to the surface treatment, a copper metallization layer may be deposited onto barrier layer 16 and within feature 20, step 34.

Figure 3:
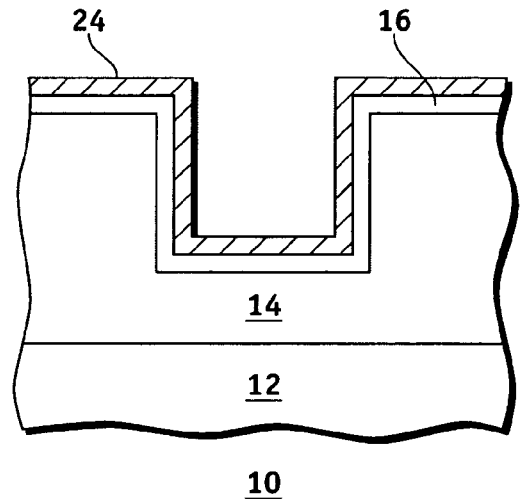
FIG. 3 is a cross-sectional view of the portion of the work piece of FIG. 1 having a protective layer overlying the barrier layer.

As illustrated in FIG. 3, in accordance with one embodiment of the invention, surface 22 may be subjected to a surface treatment that results in the formation of a protective layer 24 overlying barrier layer 16. Protective layer 24 may be formulated to prevent or minimize the oxidation of barrier layer 16, thus preventing or minimizing the formation of an oxide layer overlying barrier layer 16 that may interfere with the subsequent deposition of copper overlying barrier 16. Protective layer 24 may also prevent or minimize the deposition of other contaminants on barrier layer 16 that may interfere with the deposition of a copper layer on barrier layer 16.

In accordance with one exemplary embodiment of the invention, protective layer 24 may be formed from silane or diborane or other like chemicals. In another exemplary embodiment of the invention, protective layer 24 may be formed from a sulfur-containing gas, a nitrogen-containing gas and/or a phosphorous-containing gas. Protective layer 24 can be formed by chemical vapor deposition (CVD), atomic layer deposition (ALD) or any other suitable deposition process to a thickness, for example, of no greater than about 20 angstroms, preferably no greater than about 10 angstroms. Protective layer 24 may be maintained on barrier layer 16 for as long as protection from oxidation and/or contamination is needed and then may be removed prior to the deposition of copper overlying barrier layer 16. Protective layer 24 may be removed by any suitable etchant. Preferably, the etchant is formulated to remove protective layer 24 but does not etch, or does not significantly etch, barrier layer 16. Examples of suitable etchants include, for example, sulfuric acid, nitric acid, a combination of hydrogen peroxide and sulfuric acid, and the like. Alternatively, protective layer 24 may be removed by exposure to a copper plating solution that is formulated to remove protective layer 24 and to deposit copper on barrier layer 16.

In accordance with an exemplary embodiment of the present invention, protective layer 24 may be formed in the same processing apparatus as used to form barrier layer 16 to prevent or minimize the oxidation of barrier layer 16 by exposure to the ambient environment and to prevent or minimize the contamination of barrier layer 16 by contaminants that may interfere with the subsequent deposition of a copper layer over barrier layer 16. For example, a barrier layer 16 may be deposited within feature 20 in a CVD chamber. After the formation of barrier layer 16, the CVD chamber may be flushed of the gases used to form barrier layer 16 and gases to form protective layer 24 may be introduced into the chamber. Chemical vapor deposition may then proceed to form protective layer 24. In this manner, barrier layer 16 is not exposed to oxygen or other contaminants present in the ambient environment. In an alternative embodiment of the present invention, protective layer 24 may be formed in a chamber separate from but connected to the chamber used to form barrier layer 16 such that, upon transfer from the first chamber to the second chamber, protective layer 24 is not exposed to the ambient environment. In another embodiment of the present invention, protective layer 24 may be formed in a processing apparatus separate from the processing apparatus used to form barrier layer 16 but exposure of barrier layer 16 to the ambient environment is prevented or minimized by, for example, limiting the amount of time barrier layer 16 is exposed to the ambient environment or by transferring work piece 10 by means so that barrier layer 16 is otherwise not exposed to the ambient environment.

In accordance with another exemplary embodiment of the present invention, protective layer 24 may comprise copper. Copper protective layer 24 may be formed by CVD, ALD, PVD (including, but not limited to, planar-magnetron PVD and ionized PVD), or any other suitable deposition method. Preferably, copper protective layer 24 is deposited to a thickness sufficient to protect barrier layer 16 from oxidation or contamination due to exposure to ambient conditions but is not grown beyond that thickness. Growth beyond this thickness (such as that necessary to form a copper seed layer) is not necessary as barrier layer 16 is formed of a material that permits or facilitates the nucleation of copper thereon. Preferably, copper protective layer 24 is grown to a thickness no greater than about 20 angstroms. More preferably, copper protective layer 24 is grown to a thickness no greater than about 10 angstroms. In addition, it is not necessary to remove copper protective layer 24 prior to the electrochemical deposition of copper.

In accordance with an exemplary embodiment of the present invention, copper protective layer 24 may be formed in the same processing apparatus as used to form barrier layer 16 to prevent or minimize the oxidation of barrier layer 16 by exposure to the ambient environment and to prevent or minimize the contamination of barrier layer 16 by contaminants that may interfere with the subsequent deposition of a copper layer over barrier layer 16. For example, a barrier layer 16 may be deposited within feature 20 in a CVD chamber. After the formation of barrier layer 16, the CVD chamber may be flushed of the gases used to form barrier layer 16 and a copper-containing precursor along with reactant gases to form copper protective layer 24 may be introduced into the chamber. Chemical vapor deposition then may proceed to form copper protective layer 24. In this manner, barrier layer 16 is not exposed to oxygen or other contaminants present in the ambient environment. In an alternative embodiment of the present invention, copper protective layer 24 may be formed in a chamber separate from but connected to the chamber used to form barrier layer 16 such that, upon transfer from the first chamber to the second chamber, barrier layer 16 is not exposed to the ambient environment. In another embodiment of the present invention, copper protective layer 24 may be formed in a processing apparatus separate from the processing apparatus used to form barrier layer 16 but exposure of barrier layer 16 to the ambient environment is prevented or minimized by, for example, limiting the amount of time barrier layer 16 is exposed to the ambient environment or by transferring work piece 10 by means so that barrier layer 16 is otherwise not exposed to the ambient environment.

Referring again, to FIG. 1, in accordance with another embodiment of the invention, prior to the electrochemical deposition of copper overlying the barrier layer 16, surface 22 may be subjected to a surface treatment that removes any oxide or contaminants thereon prior to electrochemically depositing copper on barrier layer 16. In one exemplary embodiment of the present invention, surface 22 may be subjected to an acidic solution that is formulated to remove any oxide and/or contaminant from surface 22 of barrier layer 16. Examples of acidic solutions suitable for removing any oxide and/or contaminant from surface 22 includes, but is not limited to, sulfuric acid solutions, nitric acid solutions, hydrochloric acid solutions, aquaregia (nitrohydrochloric acid) solutions, and combinations thereof. Preferably, the acidic solutions comprise an acidic concentration of about ten percent (10%) to about sixty percent (60%) by weight, although it will be understood that any suitable acidic concentration may be used to form the acidic solutions.

In accordance with another embodiment of the invention, prior to the electrochemical deposition of copper overlying the barrier layer 16, surface 22 may be subjected to a surface treatment that enhances, increases, and/or improves the density of nucleation sites on surface 22 for electrodeposition. In one exemplary embodiment, surface 22 may be subjected to a halide acid, such as, for example, hydroiodic acids, hydrobromic acids, hydrochloric acids, and the like.

Figure 4:
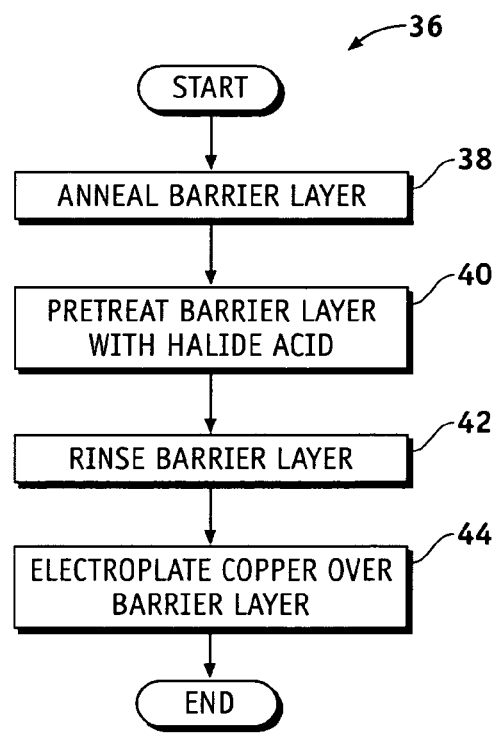
FIG. 4 is a flow chart illustrating another exemplary method for the electrochemical deposition of copper onto a barrier layer in accordance with the present invention.

In a preferred embodiment of the invention, surface 22 may be exposed to HI, HBr, HCl, and/or a combination thereof. Surface 22 may be exposed to the halide acid for a time that is suitable for enhancing or increasing nucleation sites on the barrier layer surface and facilitating uniform deposition of copper. With reference now to FIGS. 1 and 4, an exemplary process 36 using a halide acid for pretreating and plating a wafer 10 is provided. The overall process 36 will first be described generally. First, barrier layer 16 is annealed, step 38. Then, barrier layer 16 is pretreated with the halide acid, step 40. Barrier layer 16 then may be rinsed to remove residual halide acid from the wafer, step 42. Lastly, copper is electroplated over the barrier layer 16, step 44.

As briefly mentioned above, first, barrier layer 16 may be annealed, step 38. This step may be performed in any one of numerous conventional manners. For example, the wafer 10 may be placed into a conventional annealing oven in an oxygen-free environment. In another exemplary embodiment, nitrogen gas is flowed through the annealing oven to create the oxygen-free environment. In still another exemplary embodiment, annealing may be conducted at a temperature in a range of about 100° C. to about 500° C. In some exemplary embodiments, the temperature may be varied during the annealing process. The annealing may be performed for a time period in a range of about 10 seconds to about 1000 seconds, preferably in a range of about 60 seconds to about 200 seconds. In one exemplary embodiment, annealing may be conducted continuously during the entire time period.

Next, barrier layer 16 is pretreated with the halide acid, step 40. During the step 40, barrier layer 16 may be contacted with halide acid that has an acidic concentration in water in the range of about five percent (5%) to about sixty percent (60%). In one exemplary embodiment, barrier layer 16 is pretreated with a hydroiodic acid, preferably HI, having a concentration in water in the range of about fifteen percent (15%) to about sixty percent (60%). In a more preferred embodiment, barrier layer 16 is pretreated with HI having a concentration in water of between about forty-five percent (45%) to about forty-seven percent (47%) hydroiodic acid; however, any other suitable concentration of other halide acids may be used as well. The halide acid may be sprayed onto barrier layer 16 or, alternatively, work piece 10 may be immersed in the acid or otherwise contacted with the acid. Barrier layer 16 preferably is exposed to the halide acid for about one (1) to about one hundred (100) seconds, more preferably about five (5) to about fifteen (15) seconds. The step of contacting the barrier layer 16 with the halide acid preferably occurs at a temperature in the range of about 0° C. and 100° C., most preferably a temperature in the range of about 18° C. and 25° C.

After barrier layer 16 is sufficiently contacted with halide acid, barrier layer 16 is rinsed, step 42. Any one of numerous types of solutions may be used to rinse barrier layer 16. For example, distilled water, deionized water, or any similar solution may be used. Preferably, work piece 10 is rinsed for a duration of time that is sufficient to remove any residual halide acid from work piece 10; thus, work piece 10 is rinsed for a duration in the range of about one (1) to about sixty (60) seconds, most preferably from about twenty (20) to about thirty (30) seconds. In some embodiments, work piece 10 may be dried before the step 38. Any one of numerous conventional manners may be employed to dry wafer 10. For example, the wafer 10 may be spun dry, air-dried, and the like. Alternatively, work piece 10 may be maintained in a wet environment, such as, for example, in deionized water, distilled water, or any other appropriate wetting fluid.

Next, copper may be plated over barrier layer 16, step 44. In this regard, any one of numerous conventional manners by which to plate copper onto a work piece may be employed, for example, electroplating, immersion, and the like. In one exemplary embodiment, work piece 10 is at least partially submerged into a Cu plating bath and at least one current is applied to the wafer. The Cu plating bath may be any one of numerous appropriate Cu plating bath solutions. For example, the Cu plating bath solution may include between about 2 to about 200 g/L of sulfuric acid, between about 15 to about 60 g/L of cupric ion, between about 20 to about 100 mg/L of chloride ion, and various organic additives. It will be appreciated that any one of numerous appropriate compositions that yield cupric ions in solution may be used, such as, for example, copper sulfate pentahydrate. Similarly, any one of numerous appropriate compositions that yield chloride ions in solution may be used as well, such as, for example, hydrochloric acid. The organic additives may be any one of numerous additives that may promote bottom-up fill and defect free deposition of copper.

As briefly mentioned above, after work piece 10 is submerged into the Cu plating bath solution, at least one current is applied to the wafer. Any one of numerous suitable current density ranges may be applied for a suitable duration for achieving a desired nucleation and uniform deposition of the Cu. For example, a current density range of between about 1 to about 60 mA/cm$^2$ may be appropriate. Furthermore, it will be appreciated that more than one current can be applied to the wafer. In one exemplary embodiment, three successive currents are applied to the bath. In still another exemplary embodiment, a first current density in the range of between about 10 to about 30 mA/cm$^2$ is applied to the surface 22 for between about 0.01 to about 3.0 seconds, a second current density in the range of between about 6 to about 15 mA/cm$^2$ is then applied to the wafer surface for between about 12 to about 18 seconds, and a third current density in the range of between about 40 to about 75 mA/cm$^2$ is applied to the surface 22 for between about 20 to about 100 seconds.

In other exemplary embodiments, work piece 10 may be subjected to certain flow conditions that direct the Cu plating bath solution to work piece 10, wherein a flow rate of between about 4 to about 25 L/min. may be used. In still other exemplary embodiments, work piece 10 may be rotated while in the Cu plating bath solution, for instance, at a speed of between about 5 to about 100 rotations/min.

With reference again to FIG. 1, in another exemplary embodiment of the present invention, prior to the electrochemical deposition of copper overlying barrier layer 16, surface 22 may be subjected to a surface treatment that exposes barrier layer 16 to an alkaline solution that is formulated to remove any oxide and/or contaminant from surface 22 of barrier layer 16. In a preferred embodiment of the invention, the alkaline solution also may be formulated to remove a portion of barrier layer 16 at surface 22 to ensure that at least a substantial portion of the oxide and/or contaminants have been removed. Preferably, no more than about 10 angstroms of barrier layer 16 is removed. Examples of alkaline solutions suitable for removing any oxide and/or contaminant from surface 22 includes, but is not limited to, alkali metal chlorites, such as sodium hypochlorite, potassium hypochlorite, sodium chlorite, potassium chlorate, sodium perchlorate, potassium perchlorate, manganates such as potassium permanganate, and the like.

After removal of any oxide or contaminant(s) from barrier layer 16, work piece 10 then may be rinsed in de-ionized water, dried, and placed in a processing unit for the electrochemical deposition of copper overlying barrier layer 16. Exposure of barrier layer 16 to the ambient environment may be prevented or minimized by, for example, limiting the amount of time barrier layer 16 is exposed to the ambient environment or by transferring work piece 10 by means so that barrier layer 16 is otherwise not exposed to the ambient environment.

In a further exemplary embodiment of the invention, prior to the deposition of copper overlying barrier layer 16, surface 22 may be subjected to an alkaline solution, such as that described above, that is formulated to remove any oxide and/or contaminant from surface 22 of barrier layer 16 and then may be subjected to an acidic solution that is formulated to remove any ions and/or other contaminants that may result from exposure to the alkaline solution and that cannot be removed by a rinse in de-ionized water. In an alternative embodiment, prior to the deposition of copper overlying barrier layer 16, surface 22 may be subjected to an acidic solution, such as that described above, that is formulated to remove any oxide and/or contaminant from surface 22 of barrier layer 16 and then may be subjected to an alkaline solution that is formulated to remove any ions and/or other contaminants that may result from exposure to the acidic solution and that cannot be removed by a rinse in de-ionized water.

In another exemplary embodiment of the present invention, prior to the deposition of copper overlying barrier layer 16, surface 22 may be subjected to a surface treatment that comprises applying an anodic current pulse to surface 22 to desorb or dissolve any oxide and/or contaminants that may interfere with the deposition of copper. Using this method, work piece 10 may be placed in a copper plating solution and current may be applied such that work piece 10 is made an anode. The anodic current may have a magnitude and may be applied to surface 22 for a period that are sufficient to remove the oxide and/or contaminants. Preferably, the anodic current has a magnitude in the range of about 1 to about 50 $mA/cm^2$ and, more preferably, has a magnitude of about 10 $mA/cm^2$ and is applied for about 0.5 seconds to 10 seconds, more preferably no more than about 2 seconds. After application of the anodic current pulse, work piece 10 may remain in the copper plating solution and a suitable cathodic current may be applied to surface 22 to commence the electrochemical deposition of copper overlying the now-clean barrier layer 16.

In yet another exemplary embodiment of the present invention, prior to the deposition of copper overlying barrier layer 16, surface 22 may be subjected to a surface treatment that comprises applying to surface 22 for a short period of time an initial cathodic current pulse having a high magnitude relative to the initial magnitude of the cathodic current utilized for the electrochemical deposition of the copper layer. In one embodiment of the present invention, the initial cathodic current pulse has a magnitude of about 25 to 200 $mA/cm^2$, preferably a magnitude of about 50 $mA/cm^2$. The initial cathodic current pulse is applied for a period in the range of about 0.5 to about 10 seconds, preferably about 0.5 to about 3 seconds. The cathodic current then may be suitably reduced and applied to commence the electrochemical deposition of copper overlying barrier layer 16. Without being bound by theory, it is believed that the application of a relatively high-magnitude initial cathodic current pulse for a short period of time may result in liberation of atoms from barrier layer 16 due to the reduction of any oxide on barrier layer 16, thus ensuring the removal of at least a significant portion of any oxide on surface 22 of barrier layer 16. It also is possible that the application of a relatively high-magnitude initial cathodic current pulse for a short period of time may serve to free surface 22 of barrier layer 16 of contaminants that may be present on surface 22 and/or may serve to improve copper nucleation allowing for more uniform copper deposition. In one exemplary embodiment of the present invention, an initial cathodic current pulse having a magnitude of 25-200 $mA/cm^2$ may be applied to surface 22 for about 0.5 to 3 seconds and the cathodic current then may be reduced to a magnitude of about 1 to about 10 $mA/cm^2$ to initiate copper deposition. The cathodic current then may be increased, either in steps or by gradual increase, as needed to complete deposition with a magnitude of about 25-200 $mA/cm^2$.

In a further embodiment of the present invention, an anodic current may be applied to surface 22 followed by an initial cathodic current pulse. For example, an anodic current having a magnitude of about 10 $mA/cm^2$ may be applied to surface 22 of work piece 10, as described above, for a period about 1 second to 10 seconds. Application of the anodic current may be followed by the application of an initial cathodic current pulse, such as that described above, having a magnitude of about 25-200 $mA/cm^2$ and applied for a period of about 0.5 to 3 seconds. The cathodic current then may be reduced to a magnitude of about 1 to about 10 $mA/cm^2$ to initiate copper electrochemical deposition. The cathodic current then may be increased, either in steps or by gradual increase, as needed to complete copper deposition.

While at least one exemplary embodiment has been presented in the foregoing detailed description, it should be appreciated that a vast number of variations exist. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing the exemplary embodiment or exemplary embodiments. It should be understood that various changes can be made in the function and arrangement of elements without departing from the scope of the invention as set forth in the appended claims and the legal equivalents thereof.

What is claimed is:

1. A method for depositing copper overlying a work piece, the method comprising the steps of:
   depositing overlying the work piece a barrier layer having a surface;
   annealing said surface of said barrier layer in an oxygen-free environment to form an annealed thin film;
   after the step of annealing, exposing said surface of said barrier layer to a halide acid solution adapted to facilitate deposition of copper on said barrier layer; and
   electrochemically depositing copper overlying said barrier layer.

2. The method of claim 1, wherein the step of depositing overlying a work piece a barrier layer comprises depositing overlying the work piece a layer of material selected from the group comprising ruthenium, cobalt, molybdenum, tungsten, rhodium, palladium, osmium, rhenium, iridium, and platinum.

3. The method of claim 1, wherein the step of exposing said surface of said barrier layer to a halide acid solution comprises the step of exposing said surface of said barrier layer to a halide acid solution having an acidic concentration of between about five percent (5%) to about sixty percent (60%) by weight.

4. The method of claim 3, wherein the step of exposing said surface of said barrier layer to a halide acid solution comprises the step of exposing said surface of said barrier layer to a halide acid solution having an acidic concentration of between about forty-five percent (45%) to about forty-seven percent (47%) by weight.

5. The method of claim 1, wherein the step of exposing said surface of said barrier layer to a halide acid solution comprises the step of exposing said surface of said barrier layer to a halide acid solution for between about one (1) and one hundred (100) seconds.

6. The method of claim 1, wherein the step of exposing said surface of said barrier layer to a halide acid solution comprises the step of exposing said surface of said barrier layer to a halide acid solution for between about five (5) and ten (10) seconds.

7. The method of claim 1, wherein the step of exposing said surface of said barrier layer to a halide acid solution comprises the step of exposing said surface of said barrier layer to a halide acid solution at a temperature of between about 0° and about 100° C.

8. The method of claim 7, wherein the step of exposing said surface of said barrier layer to a halide acid solution comprises the step of exposing said surface of said barrier layer to a halide acid solution at a temperature in the range of about 18° C. and 25° C.

9. The method of claim 1, further comprising:
   rinsing the halide acid solution from the barrier layer using at least one of distilled water and deionized water.

10. The method of claim 1, wherein the step of electrochemically depositing comprises at least one of depositing by electroplating and depositing by electrochemical deposition.

11. The method of claim 1, wherein the step of annealing comprises annealing said annealed thin film in an oxygen-free environment at a temperature in a range of about 100° C. to about 500° C. for a time period in a range of about 10 seconds to about 1000 seconds.

12. A method for electrochemically depositing a copper layer onto a ruthenium layer of a work piece, the method comprising the steps of:

depositing on the work piece a ruthenium layer having a surface;

annealing said surface of said ruthenium layer in an oxygen-free environment to form an annealed ruthenium-containing thin film;

after the step of annealing, exposing said surface of said ruthenium layer to a halide acid solution adapted to facilitate deposition of copper on said ruthenium layer; and electrochemically depositing a layer of copper overlying said ruthenium layer.

13. The method of claim 12, wherein the step of exposing said surface of said ruthenium layer to a halide acid solution comprises the step of exposing said surface of said ruthenium layer to a halide acid solution having an acidic concentration of about five percent (5%) to about sixty percent (60%) by weight.

14. The method of claim 12, further comprising annealing said surface of said ruthenium layer in an oxygen-free environment to form an annealed thin film, before the step of exposing.

15. The method of claim 14, wherein the step of annealing comprises annealing said annealed thin film in an oxygen-free environment at a temperature in a range of about 100° C. to about 500° C. for a time period in a range of about 10 seconds to about 1000 seconds.

* * * * *